US012429519B2

United States Patent
Kim et al.

(10) Patent No.: US 12,429,519 B2
(45) Date of Patent: Sep. 30, 2025

(54) TEST APPARATUS FOR IMAGE SENSOR PACKAGE

(71) Applicant: TSE CO., LTD, Cheonan-si (KR)

(72) Inventors: Min Cheol Kim, Cheonan-si (KR); Sol Lee, Cheonan-si (KR)

(73) Assignee: TSE CO., LTD., Chungcheongnam-Do (KR)

( * ) Notice: Subject to any disclaimer, the term of this patent is extended or adjusted under 35 U.S.C. 154(b) by 169 days.

(21) Appl. No.: 18/492,008

(22) Filed: Oct. 23, 2023

(65) Prior Publication Data

US 2024/0151769 A1    May 9, 2024

(30) Foreign Application Priority Data

Nov. 4, 2022   (KR) .................. 10-2022-0145915

(51) Int. Cl.
   *G01R 31/28*   (2006.01)
   *G01R 1/04*    (2006.01)
   *G01R 1/073*   (2006.01)

(52) U.S. Cl.
   CPC ....... *G01R 31/2889* (2013.01); *G01R 1/0466* (2013.01); *G01R 1/07342* (2013.01); *G01R 31/2863* (2013.01)

(58) Field of Classification Search
   CPC .. G01R 1/07307; G01R 1/07385; G01R 1/36; G01R 3/00; G01R 31/2601; G01R 31/2889
   See application file for complete search history.

(56) References Cited

U.S. PATENT DOCUMENTS

| 7,427,768 B2 * | 9/2008 | Kim ................. H10F 39/804 |
| | | 250/559.4 |
| 11,609,244 B2 | 3/2023 | Oh et al. |
| 2011/0298487 A1 | 12/2011 | Katsuma et al. |
| 2013/0147507 A1 * | 6/2013 | Lee ................. G01R 1/0408 |
| | | 324/756.07 |
| 2021/0293880 A1 | 9/2021 | Oh et al. |

FOREIGN PATENT DOCUMENTS

| JP | 2007-198861 A | 8/2007 |
| JP | 2011-257227 A | 12/2011 |
| KR | 10-1212946 B1 | 12/2012 |
| KR | 10-1392399 B1 | 5/2014 |
| KR | 10-2021-0120800 A | 10/2021 |

OTHER PUBLICATIONS

Office Action dated Mar. 29, 2024 from Korean priority Application No. 10-2022-0145915 (21 pages).
Japanese Office Action with English translation, Nov. 5, 2024, pp. 1-2, issued in Japanese Application No. 2023-181591.

\* cited by examiner

Primary Examiner — Tung X Nguyen
(74) Attorney, Agent, or Firm — Crowell & Moring LLP; John C. Freeman

(57) ABSTRACT

A test apparatus for testing image sensor packages. The test apparatus is configured to stably vacuum-absorb an image sensor package in a surface manner, wherein when a vacuum adsorption sheet having a package adsorption hole in the shape of a wide square surface is coupled to the bottom of the floating plate at which an upper socket is seated, a vacuum line is formed by connecting the cover vacuum hole of the pusher, the board vacuum hole of the upper circuit board, the plate vacuum hole of the floating plate, and the package adsorption hole of the vacuum adsorption sheet together.

11 Claims, 11 Drawing Sheets

TEST APPARATUS FOR IMAGE SENSOR PACKAGE

This application claims under 35 U.S.C. § 119(a) the benefit of the filing date of Korean Patent Application No. 10-2022-0145915, filed on Nov. 14, 2022.

BACKGROUND

Field

The present disclosure relates to a test apparatus for a semiconductor device for light detection and, more particularly, to a test apparatus for an image sensor package that can automatically test whether the image sensor package is defective before it is assembled into a camera module.

Description of Related Art

Image sensors, as semiconductor devices that have the function of taking images of people or objects, are used as an essential component of major information and communication equipment, such as smartphones, automobile driving assistance systems, autonomous driving cars, and network cameras, and their market size is steadily growing.

These image sensors are configured in the form of camera modules and are mounted on such equipment. Such a camera module is composed of a lens, a holder, an infrared (IR) filter, an image sensor, and a printed circuit board (PCB). In the camera module, the lens forms an image, the image formed by the lens is focused on the image sensor through the IR filter, and the image sensor captures the image by converting the optical signal of the image into an electric signal.

Among these components, the image sensor that converts an optical signal into an electrical signal is mounted directly on the camera module as a bare chip, or is packaged and then mounted on the camera module. A chip-on-board (COB) method may be used to mount the image sensor as a bare chip directly on the camera module, but it has a high defect rate due to the inflow of dust particles during the manufacturing process and limitations in miniaturization. So, a widely used method is to pre-package the image sensor chip and mount it on the camera module by using a fabricated image sensor package.

Among camera module defects, the most critical and most common defects are defects caused by dust inflow into the pixel region of the image sensor, so the test procedure for determining whether the image sensor is defective after assembling the image sensor package into a camera module is not desirable. In other words, it is desirable to determine whether the image sensor package is defective before being assembled into a camera module. However, an existing apparatus for testing an image sensor package has a function of testing only for simple electrical defects by connecting the connection terminal of the image sensor package to an external terminal and then applying an electric current, so that there is a problem in that optical characteristic tests, such as whether the amount of light received by the image sensor is constant for the light emitted from the light source, cannot be performed.

Recently, test apparatuses that test optical properties of image sensor packages have been developed. FIGS. 1 to 3 show a legacy test apparatus 100 for an image sensor package; FIG. 1 is a view showing a legacy test apparatus for testing an image sensor package, FIG. 2 is a view illustrating the operation of the legacy test apparatus, and FIG. 3 shows a part of the legacy test apparatus that adsorbs the image sensor package.

As shown in the drawings, the image sensor package 10 has a structure in which a light-receiving surface 11 is located at the bottom, and a sensor terminal 12, which is usually made of a solder ball, is located at the top. To move the image sensor package to the test position, the upper surface of the image sensor package should be vacuum-adsorbed, but the sensor terminal made of a solder ball is formed on the upper surface and the upper surface of the image sensor package is not flat, so it is not possible to move the image sensor package using a vacuum picker. Hence, in a test apparatus for an image sensor package, a pick and place method should be used in which a vacuum line is formed in a pusher operated by a driving part DP such as a handler and the pusher adsorbs the image sensor package and places it at the test position.

The legacy test apparatus 100 of an image sensor package is configured to include a lower socket 30, an upper socket 60, and a pusher 70 having an upper circuit board 50 therein. The legacy test apparatus includes a package seating portion 32 on which the image sensor package 10 is seated, the lower socket 30 including a pogo pin 31 for transmitting an electric signal to a socket housing having a light source insertion portion 33 in which a light source device 20 is disposed, the upper circuit board 50 connected to the lower socket, and the pusher 70 having the upper socket 60 including pogo pins 61. The lower socket and the light source device are mounted on the tester 40, and the pogo pins of the upper socket are disposed in the socket housing so that the upper portions are in contact with the upper circuit board 50 and the lower portions are in contact with the image sensor package 10.

When the pusher 70 connected to the driving part DP of the handler transfers vacuum pressure generated by a vacuum generator VG to a socket vacuum hole 63 of the upper socket 60 through the pusher vacuum hole 71, the image sensor package 10 is adsorbed and placed on the package seating portion 32 of the lower socket 30. Then, when the tester transmits a test signal, the light source device 20 emits light; at the same time, the signal is transmitted to the image sensor package 10 through the lower socket, the upper circuit board, and the upper socket; and the image sensor package receives the light emitted from the light source device. Through this process, optical properties of the image sensor package are tested, such as whether the amount of light received by the image sensor package is constant.

However, in the legacy test apparatus 100 of an image sensor package, the upper socket is of a pogo socket type that uses a pogo pin. In general, a pogo pin has a structure in which upper and lower metal pins are placed at the top and bottom of the barrel, and a spring is interposed between the upper pin and the lower pin. The upper pin made of metal is connected to the pad of the upper circuit board in a point contact manner, and the lower pin is also connected to the solder ball terminal of the image sensor in a point contact manner. Hence, the contact is unstable and there is a high possibility of misalignment, so there is a problem of poor test yield due to unstable contact.

Additionally, since the upper and lower pins made of metal contact an electrode of the upper circuit board and a solder ball-shaped sensor terminal of the image sensor package, there is a problem that the electrode of the upper circuit board or the solder ball-shaped sensor terminal of the image sensor package may be damaged.

Further, in the case of an image sensor package in full array form, vacuum pressure should be transferred to a region between solder balls, so a vacuum region should be formed in a narrow region between pogo pins of the upper socket. FIG. 3 shows the lower surface of an adsorption unit that adsorbs an image sensor package in the legacy image sensor package test apparatus. As shown in FIG. 3, it can be seen that a number of small socket vacuum holes 63 are formed between pogo pins in the peripheral region of the upper socket. That is, the legacy test apparatus using an upper socket having pogo pins vacuum-adsorbs an image sensor package by a so-called "point method" using small socket vacuum holes in the shape of a point. The total area of these socket vacuum holes 63 is usually only 2 to 3 percent of the image sensor package area.

As a result, in the legacy test apparatus, if point-shaped socket vacuum holes are not accurately aligned with the region between solder balls, the image sensor package may be adsorbed in a wrong state; since the vacuum region is very narrow, sufficient vacuum pressure may be not transferred, so image sensor package pick-up errors may easily arise, which further reduces test yield.

Related Art

Korean Patent Gazette No. 10-1212946 (issued on Dec. 11, 2012)

SUMMARY

The disclosure aims to solve the above problems, and an object of the disclosure is to provide a test apparatus for an image sensor package that can reduce damage to the upper circuit board and the image sensor package and significantly improve test yield without pickup errors by vacuum adsorbing the image sensor package in a surface manner.

To achieve the above object, a test apparatus for image sensor packages according to the disclosure may include: an image sensor package having a light-receiving surface at the bottom and a sensor terminal at the top; a light source device mounted on a tester that provides a test signal to emit light toward the light-receiving surface of the image sensor package; a lower socket mounted on the tester, and including a package seating portion on which the image sensor package is seated, a light source insertion portion where the light source device is placed at a bottom of the package seating portion, and a pogo pin electrically connecting the tester and an upper circuit board; an upper socket made of an elastic insulating material containing a plurality of conductive particles, and having an elastic conductive portion that electrically connects the upper circuit board and the image sensor package; a pusher to which the upper circuit board on which a board vacuum hole is formed is coupled, having a cover vacuum hole through which vacuum pressure of a vacuum generator is transferred, and capable of moving toward or away from the lower socket by using power received from a driving part; and a floating plate coupled to the pusher, having a plate vacuum hole formed therein, and having a socket seating portion on which the upper socket is seated and a plate hole at the top, wherein when a vacuum adsorption sheet having a package adsorption hole for adsorbing the image sensor package is coupled to a lower part of the floating plate, a vacuum line may be formed by connecting the cover vacuum hole to the board vacuum hole, connecting the board vacuum hole to the plate vacuum hole, and connecting the plate vacuum hole to the package adsorption hole.

The test signal provided from the tester may be delivered to the image sensor package through the light source device, the lower socket, the upper circuit board, and the upper socket.

A guide portion for guiding the image sensor package may be formed on the lower surface of the floating plate so as to protrude therefrom, and the vacuum adsorption sheet may be provided with a guide hole into which the guide portion is inserted.

The package adsorption hole of the vacuum adsorption sheet may be sized to surround the plate hole of the floating plate.

The area of the package adsorption hole may be 0.1 times or more than that of the image sensor package.

The vacuum adsorption sheet may be made of an inelastic insulating material.

The inelastic insulating material may be one of polyimide film, FR4, engineering plastic, or insulation coated metal.

The pusher may include a base that accommodates the upper circuit board, the upper socket, and the floating plate, and a cover that covers the base.

The cover vacuum hole may be formed in the cover.

A gasket surrounding the cover vacuum hole and the board vacuum hole may be coupled between the cover and the upper circuit board.

A gasket surrounding the board vacuum hole and the plate vacuum hole may be coupled between the upper circuit board and the floating plate.

In the test apparatus for an image sensor package according to the disclosure, since the package adsorption hole that vacuum-adsorbs the image sensor package has a shape of a wide surface, the image sensor package can be stably adsorbed in a surface manner. In addition, since the vacuum adsorption region is formed to be more than three times larger compared to a related-art one, image sensor packages can be picked and placed stably without pickup errors, significantly improving test yield.

Also, in the test apparatus for an image sensor package according to the disclosure, vacuum sealing is provided by inserting a non-metallic gasket into the joint region between the pusher cover and the upper circuit board and between the upper circuit board and the floating plate, so that the vacuum pressure provided by the vacuum generator can be smoothly applied to the vacuum adsorption sheet without loss.

Further, in the test apparatus for an image sensor package according to the disclosure, since the vacuum adsorption sheet that adsorbs the image sensor package is composed of a sheet of inelastic insulating material, there is an advantage of mitigating the impact that occurs when it comes in contact with the image sensor package.

Further, in the test apparatus for an image sensor package according to the disclosure, the upper socket is composed of an elastic conductive portion, and the elastic conductive portion of the upper socket is connected to the solder ball-shaped sensor terminal of the image sensor package in a surface contact manner that surrounds it, so that contact resistance can be reduced and misalignment does not occur, enabling stable connection and significantly improving test yield.

Further, in the test apparatus for an image sensor package according to the disclosure, since the elastic conductive portion of the upper socket is smoothly connected to the sensor terminal of the image sensor package and the electrode of the upper circuit board, it is possible to prevent damage to the sensor terminal of the image sensor package and the electrode of the upper circuit board.

DETAILED DESCRIPTION

Hereinafter, a test apparatus for an image sensor package according to an embodiment of the disclosure will be described in detail with reference to the accompanying drawings.

In the disclosure, the upper socket is located above the image sensor package and the tester is located below the image sensor package, so "upper surface", "top", "upper end", "lower surface", "bottom", or "lower end" of a specific component will be described according to this.

Additionally, in the description with reference to the accompanying drawings, identical or related reference symbols will be given to the same elements regardless of reference symbols, and a repeated description thereof will be omitted.

Figure 4:
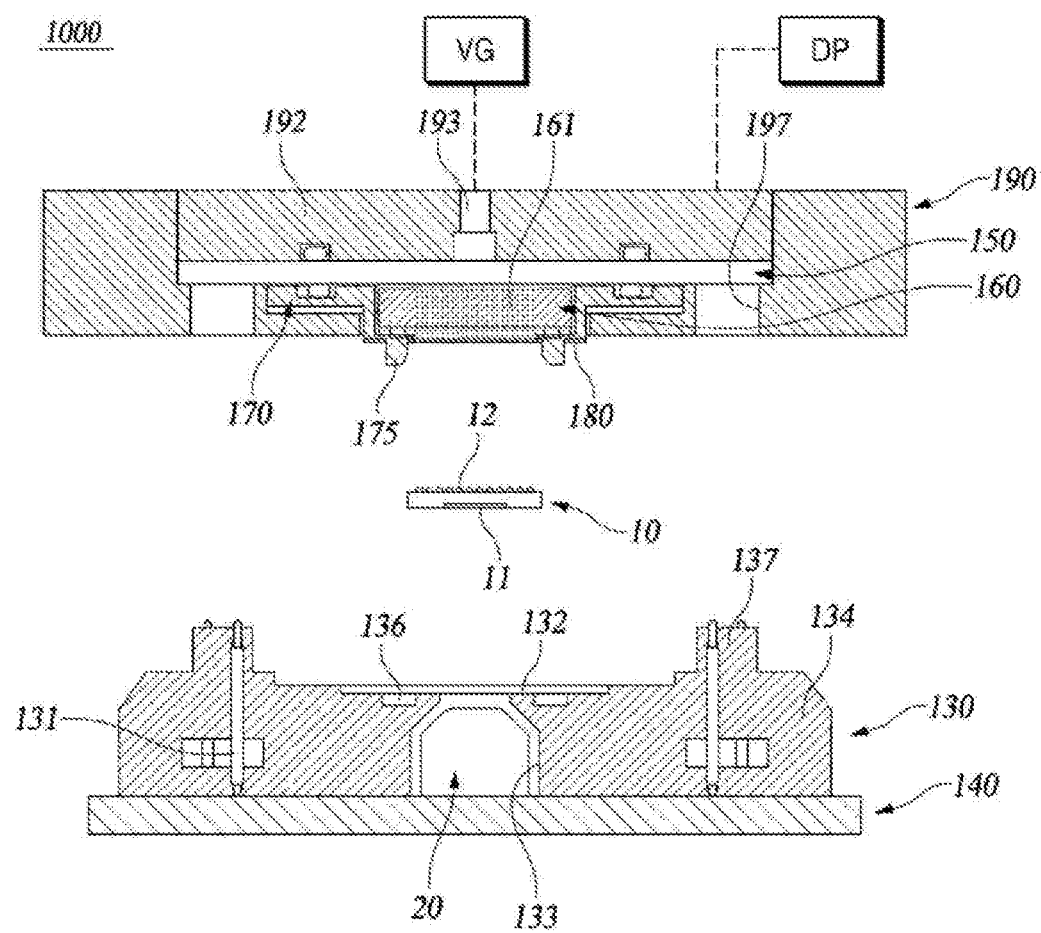
FIG. 4 is a view showing a test apparatus for testing an image sensor package according to an embodiment of the disclosure.
Figure 5:
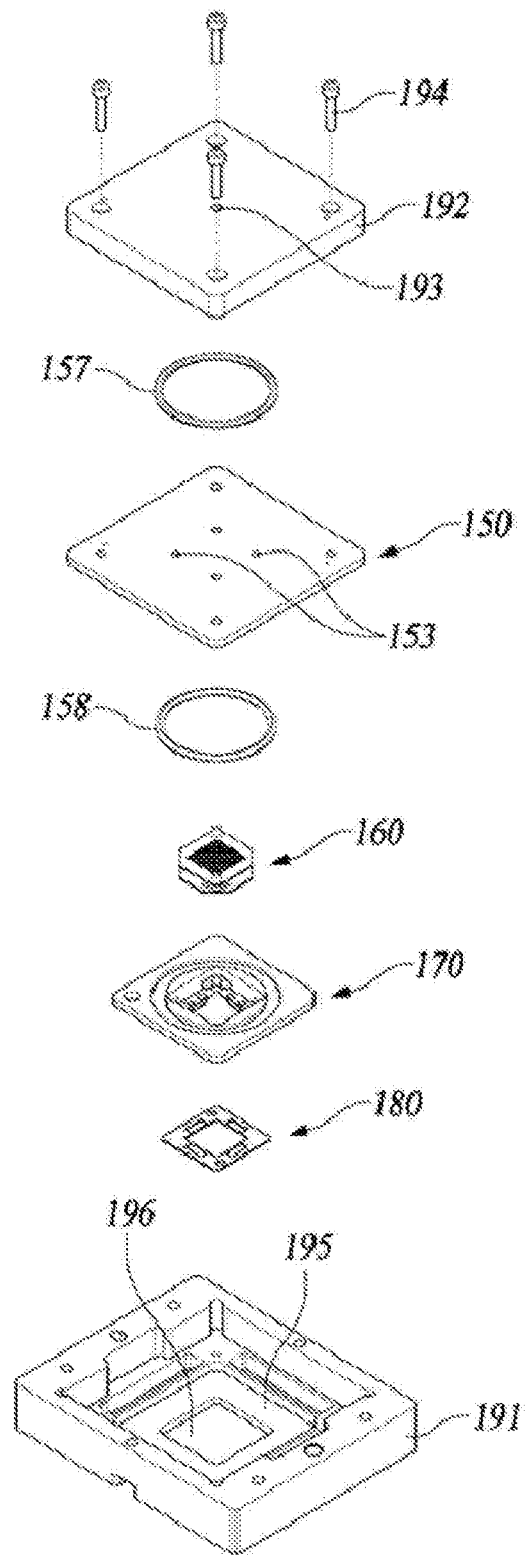
FIG. 5 is an exploded perspective view of a portion where a vacuum line is formed in the test apparatus according to an embodiment of the disclosure.
Figure 6:
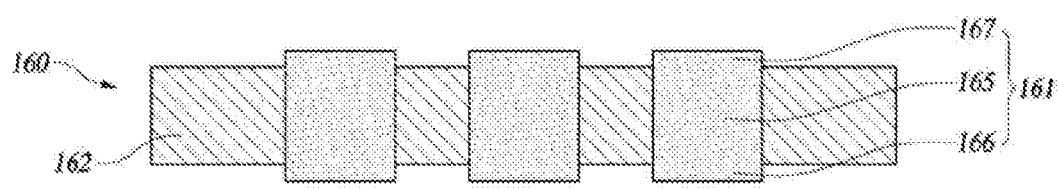
FIG. 6 is a view showing an upper socket according to an embodiment of the disclosure.
Figure 7A:
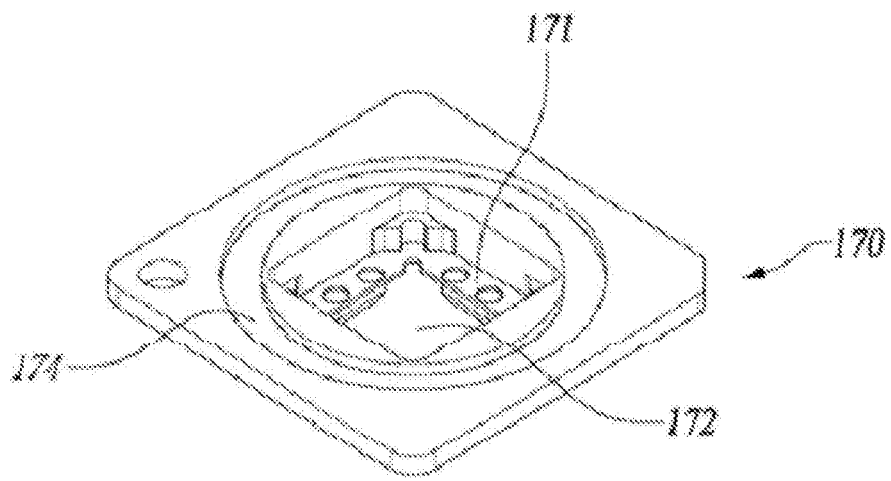
FIGS. 7A and 7B are views showing a floating plate according to an embodiment of the disclosure.
Figure 7B:
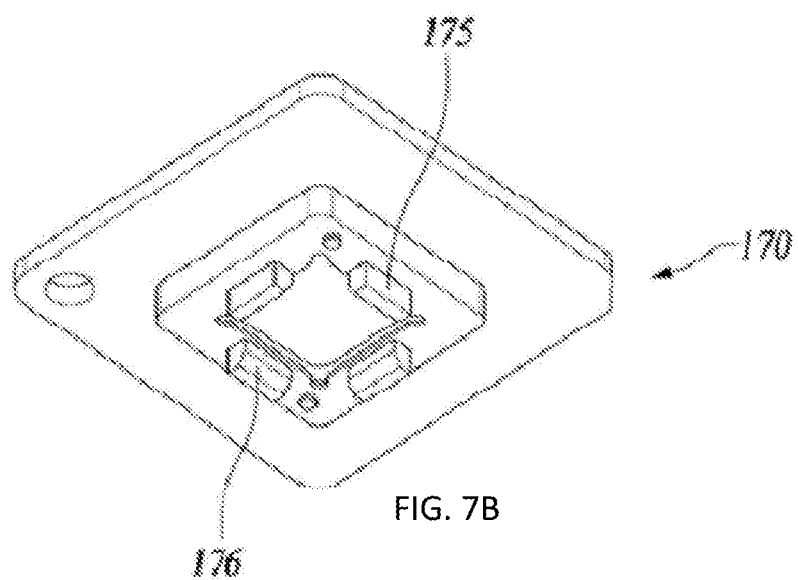
Figure 8:
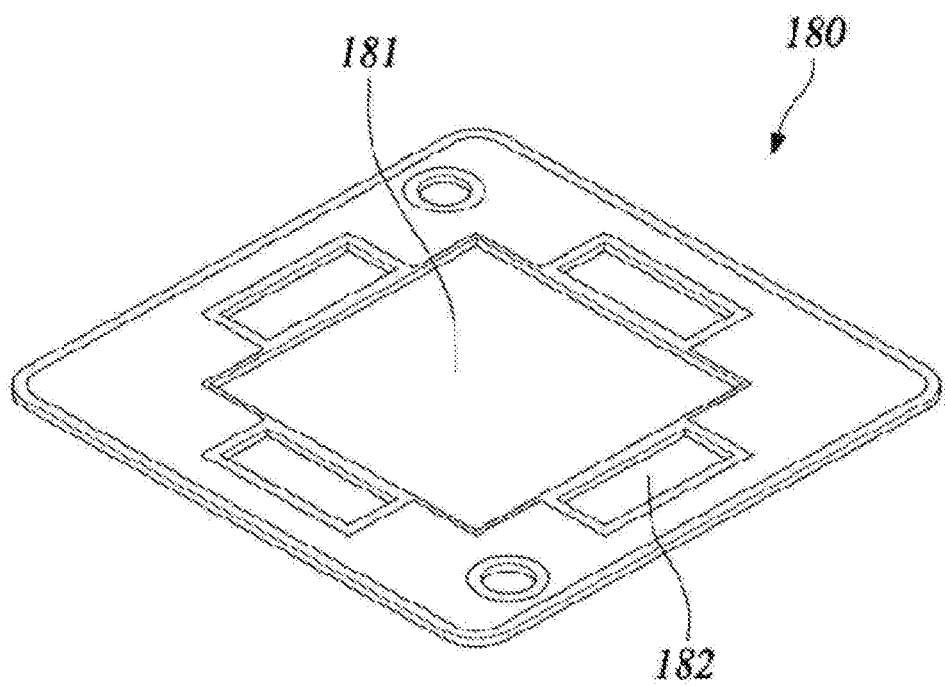
FIG. 8 is a view showing a vacuum adsorption sheet according to an embodiment of the disclosure.
Figure 9A:
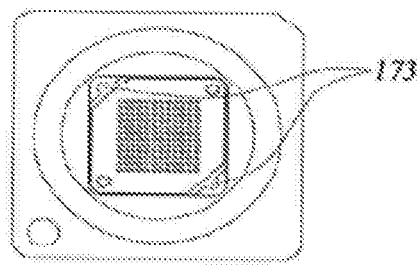
FIGS. 9A-9C are views showing a state in which the upper socket and the vacuum adsorption sheet are coupled to the floating plate according to an embodiment of the disclosure.
Figure 9B:
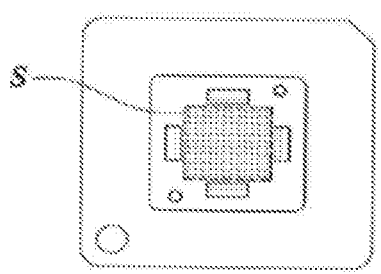
Figure 9C:
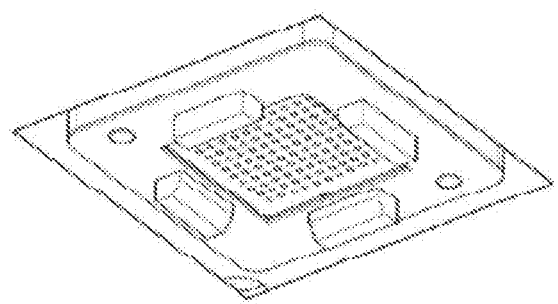
Figure 10:
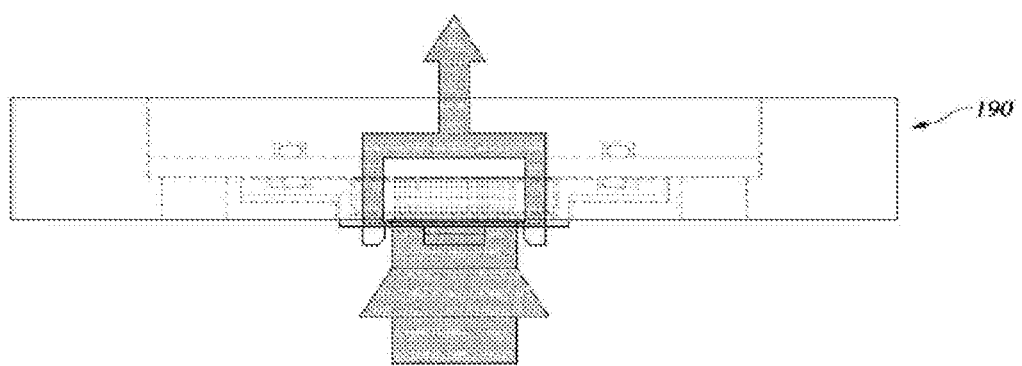
FIG. 10 is a schematic view illustrating formation of a vacuum line in the test apparatus according to an embodiment of the disclosure.
Figure 11A:
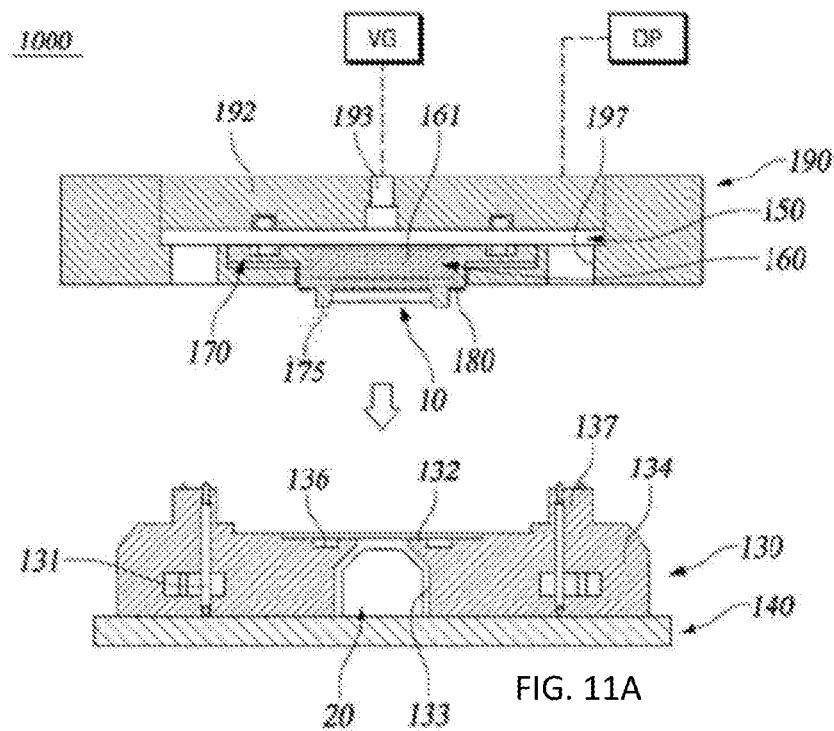
FIGS. 11A and 11B are views view showing the operation of the test apparatus for an image sensor package according to an embodiment of the disclosure.
Figure 11B:
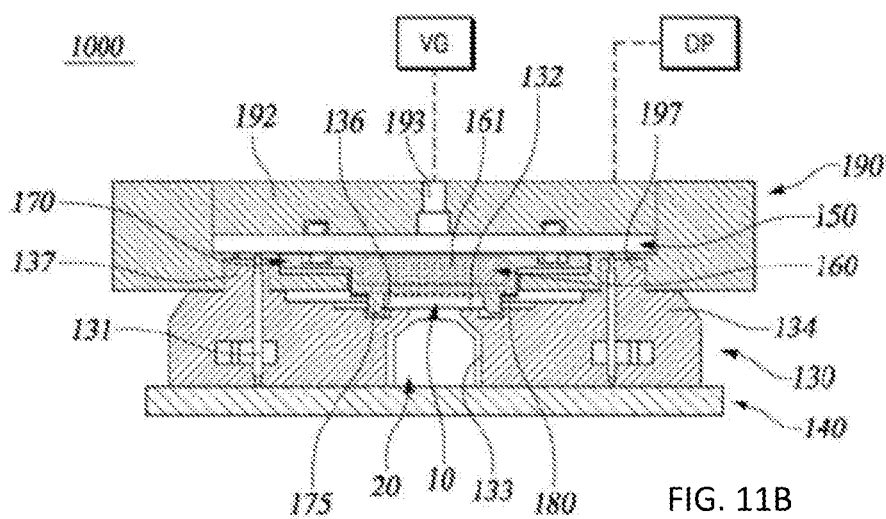

FIG. 4 is a view showing a test apparatus for testing an image sensor package according to an embodiment of the disclosure, FIG. 5 is an exploded perspective view of a portion where a vacuum line is formed in the test apparatus according to an embodiment of the disclosure, FIG. 6 is a view showing an upper socket according to an embodiment of the disclosure, FIGS. 7A and 7B are views showing a floating plate according to an embodiment of the disclosure, and FIG. 8 is a view showing a vacuum adsorption sheet according to an embodiment of the disclosure. In addition, FIGS. 9A-9C are views showing a state in which the upper socket and the vacuum adsorption sheet are coupled to the floating plate according to an embodiment of the disclosure, FIG. 10 is a schematic view illustrating formation of a vacuum line in the test apparatus according to an embodiment of the disclosure, and FIGS. 11A and 11B are views showing the operation of the test apparatus for an image sensor package according to an embodiment of the disclosure.

As shown in the above drawings, the test apparatus 1000 for an image sensor package according to an embodiment of the disclosure is a test apparatus that inspects the electrical or optical characteristics of the image sensor package that receives light emitted from a light source device, and may electrically mediate between the tester 140 that generates a test signal and the image sensor package 10.

The test apparatus 1000 for an image sensor package according to an embodiment of the disclosure includes: an image sensor package 10 having a light-receiving surface 11 at the bottom and a sensor terminal 12 at the top; a light source device 20 mounted on a tester 140 that provides a test signal, and emitting light toward the light-receiving surface of the image sensor package; a lower socket 130 mounted on the tester, and including a package seating portion on which the image sensor package is seated, a light source insertion portion 133 where the light source device is placed at the bottom of the package seating portion, and a pogo pin 131 electrically connecting the tester 140 and an upper circuit board 150; an upper socket 160 made of an elastic insulating material containing a plurality of conductive particles, and having an elastic conductive portion 161 that electrically connects the upper circuit board 150 and the image sensor package 10; a pusher 190 to which the upper circuit board on which a board vacuum hole 153 is formed is coupled, having a cover vacuum hole 193 through which vacuum pressure of a vacuum generator VG is transferred, and capable of moving toward or away from the lower socket by using power received from a driving part DP; and a floating plate 170 coupled to the pusher, having a plate vacuum hole 173 formed therein, and having a socket seating portion 171 on which the upper socket 160 is seated at the top and a plate hole 172, wherein when a vacuum adsorption sheet 180 having a package adsorption hole 181 for adsorbing the image sensor package 10 is coupled to the bottom of the floating plate 170, a vacuum line VL where the cover vacuum hole 193 is connected to the board vacuum hole 153, the board vacuum hole 153 is connected to the plate vacuum hole 173, and the plate vacuum hole 173 is connected to the package adsorption hole 181 is formed.

Components of the test apparatus 1000 according to an embodiment of the disclosure will be described in detail.

The image sensor package 10 has a light-receiving surface 11 at the bottom for receiving light and has a plurality of sensor terminals 12 in the form of solder balls at the top. As the image sensor package is a widely known element, a detailed description thereof will be omitted.

The light source device 20 is a device that emits light toward the light-receiving surface of the image sensor package and is mounted on the tester 140 that provides a test signal. The light source device 20 is disposed below the image sensor package 10 so as to emit light toward the light-receiving surface 11 of the image sensor package.

The lower socket 130 is mounted on the tester 140 and electrically connects the tester 140 and the upper circuit board 150. The lower socket 130 includes a package seating portion 132 on which the image sensor package is seated, a socket housing 134 having a light source insertion portion 133 in which the light source device is disposed under the package seating portion, and pogo pins 131 disposed to be spaced apart inside the socket housing and electrically connecting the tester 140 and the upper circuit board 150.

The package seating portion 132 protrudes so that the edge region of the image sensor package 10 is placed, and a through hole is formed in the central region of the package seating portion 132 so as to expose the light-receiving surface 11 of the image sensor package 10 downwards. A guide hole 136 into which the guide portion 175 of the floating plate 170 can be inserted is provided on the outside of the package seating portion 132.

The light source insertion portion 133 is an opening connected to the through hole of the package seating portion 132 and is a space where the light source device 20 is placed. The light source insertion portion 133 may have any shape as long as the light source device 20 can be inserted.

Figure 1:
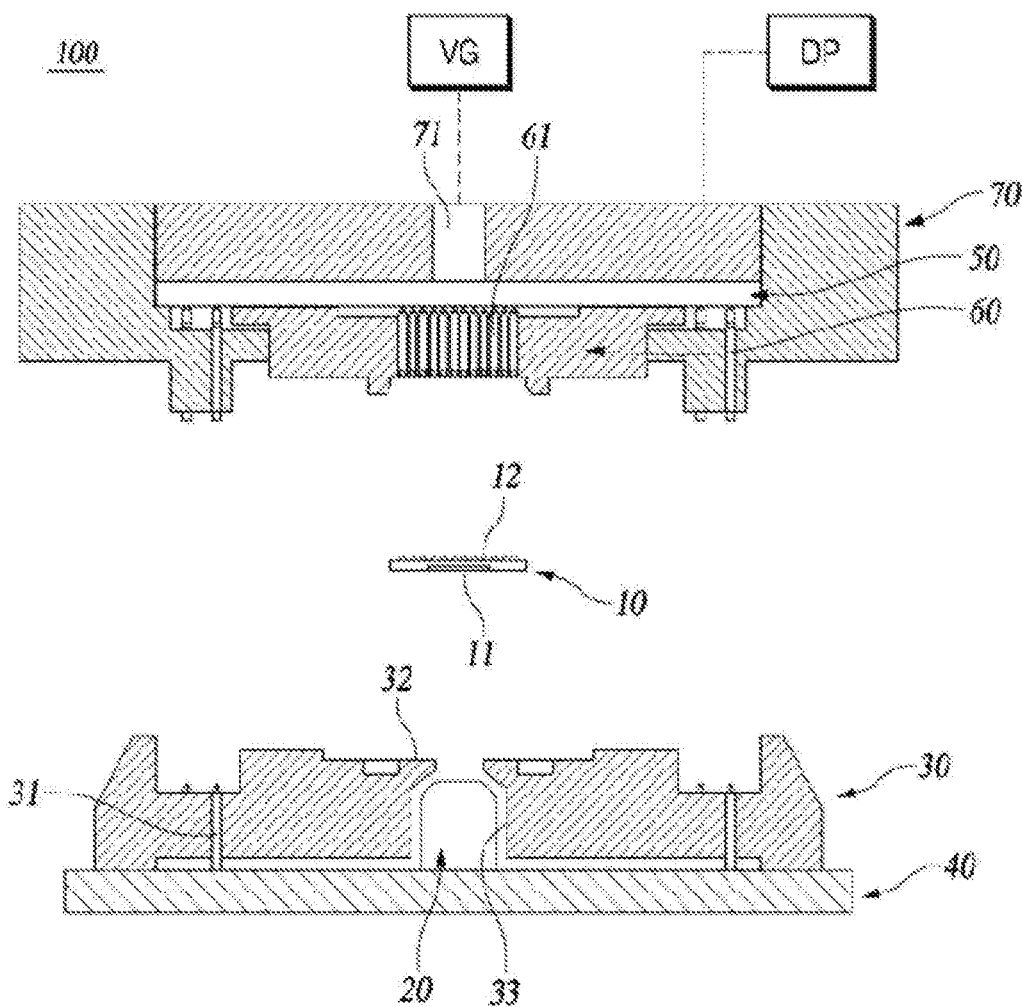
FIG. 1 is a view showing a legacy test apparatus for testing an image sensor package.
Figure 2:
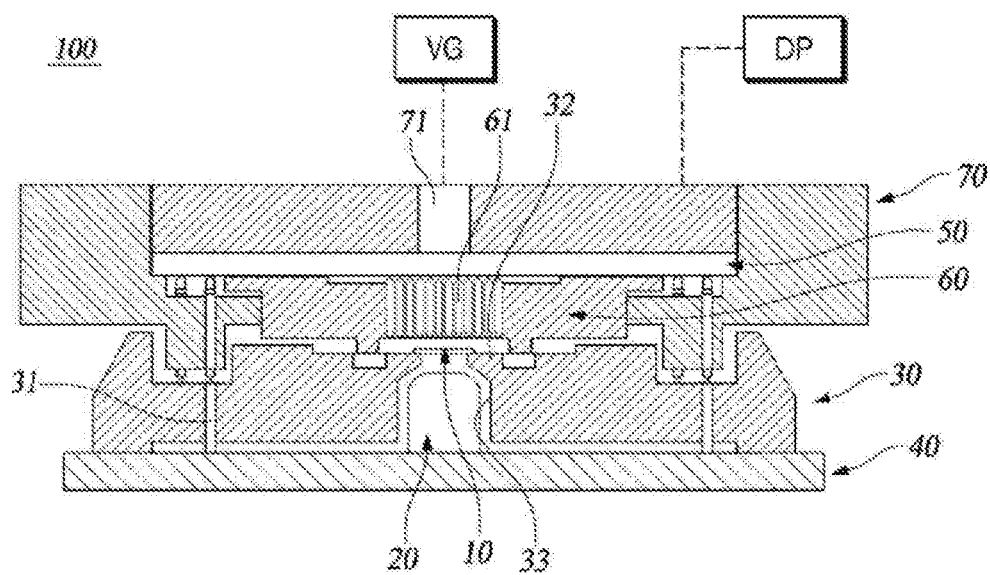
FIG. 2 is a view illustrating the operation of the legacy test apparatus.
Figure 3:
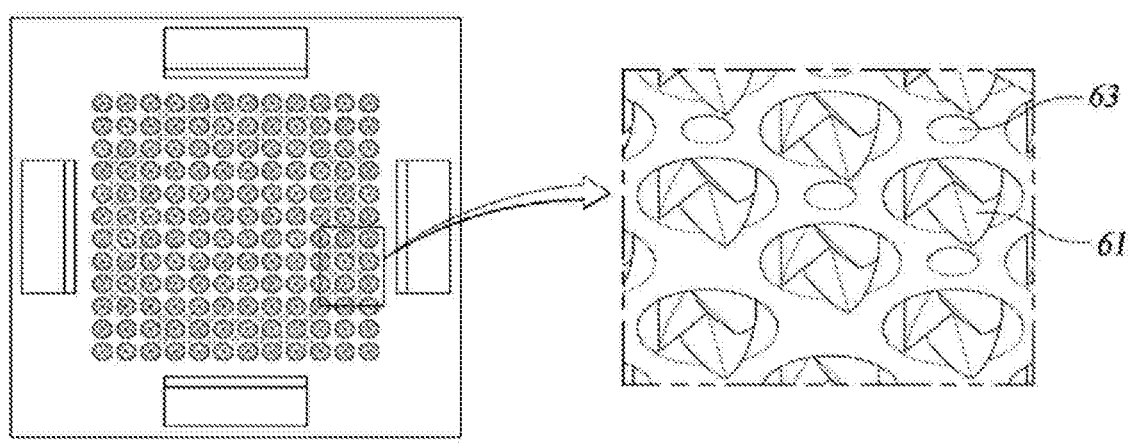
FIG. 3 shows the part that adsorbs an image sensor package in the legacy test apparatus.

The pogo pin 131 has a structure in which upper and lower pins are placed respectively at the top and bottom of the barrel, and a spring is interposed between the upper pin and the lower pin. One end of the pogo pin 131 is in contact with an electrode (not shown) provided on the upper portion of the tester 140, and the other end of the pogo pin 131 is in contact with an electrode (not shown) provided on the lower portion of the upper circuit board 150, so that the tester 140 and the upper circuit board 150 are electrically connected. The ends of the upper pin and lower pin that contact the tester and the upper circuit board may be formed in a round shape. In a legacy test apparatus, as shown in FIG. 3, the ends of the upper and lower pins are pointed in the shape of a crown, so there is a risk of damaging the electrodes of the tester and the upper circuit board. On the other hand, the round-shaped upper and lower pins can prevent damage to the electrodes of the tester and the upper circuit board.

In addition to the structure shown, the lower socket 130 can be modified into various other structures that may be mounted on the tester 140 to electrically connect the tester 140 and the upper circuit board 150.

The upper circuit board 150 is an intermediate board that connects the lower socket 130 and the upper socket 160, and has pad-shaped electrodes formed on the lower portion. The test signal provided from the tester 140 is transmitted to the upper circuit board 150 through the lower socket 130, and the upper circuit board 150 transmits the received signal to the upper socket 160. As shown in FIG. 5, a board vacuum hole 153 connecting the cover vacuum hole 193 at the upper side and the plate vacuum hole 173 at the lower side is formed in the upper circuit board 150.

The upper socket 160 is disposed under the upper circuit board 150 to electrically connect the upper circuit board 150 and the image sensor package 10. As shown in FIG. 6, in the upper socket 160, elastic conductive portions 161 composed of a plurality of conductive particles contained in an elastic insulating material are arranged to be spaced apart within the insulating part 162, and are supported by the insulating part 162. One end of the elastic conductive portion 161 may be in contact with the electrode of the upper circuit board 150, and the other end of the elastic conductive portion 161 may be in contact with the sensor terminal 12 of the image sensor package 10. A frame (not shown) that supports the upper socket and has holes formed for position alignment may be coupled to the outside of the insulating part 162.

The elastic conductive portion 161 includes a conductive portion body 165 placed within the insulating part 162, a conductive portion lower bump 166 connected to the conductive portion body 165 so as to protrude from the lower surface of the insulating part 162, and a conductive portion upper bump 167 connected to the conductive portion body 165 so as to protrude from the upper surface of the insulating part 162. When the upper socket 160 approaches closer to the lower socket 130, the conductive portion upper bump 167 and the conductive portion lower bump 166 are pressed to the terminal of the upper circuit board 150 and the sensor terminal 12 of the image sensor package 10, so that they can stably contact the terminal of the upper circuit board and the sensor terminal of the image sensor package.

Since the upper socket 160 has an elastic conductive portion 161 that has elasticity as a conductive path, when the elastic conductive portion 161 comes into contact with the electrode of the upper circuit board 150 or the sensor terminal of the image sensor package 10, a smooth connection is possible to thereby prevent damage to the electrode of the upper circuit board or the sensor terminal of the image sensor package. In addition, since the elastic conductive portion 161 is compressed while surrounding the solder ball-shaped sensor terminal, contact resistance can be reduced through connection in a surface contact manner.

A heat-resistant polymer material with a cross-linked structure, such as silicone rubber may be used for the elastic insulating material constituting the elastic conductive portion 161. The conductive particles constituting the elastic conductive portion 161 may be those that have magnetism so that they can react with a magnetic field. For example, the conductive particles may include particles of magnetic metal such as iron, nickel or cobalt, alloy particles thereof, particles containing these metals, or those that these particles are used as core particles and metals with good conductivity such as gold, silver, palladium, and radium are plated on the surface of the core particles.

The insulating part 162 may be made of an elastic insulating material or an inelastic insulating material. The same material as the elastic insulating material constituting the elastic conductive portion 161 may be used as the elastic insulating material, and various synthetic resins may be used as the inelastic insulating material.

The pusher 190 may receive locomotive power from the driving part DP to move closer to the lower socket 130 or move away from the lower socket 130. As shown in FIG. 5, the pusher 190 includes a base 191 capable of accommodating the upper circuit board 150, the upper socket 160, and the floating plate 170, and a cover covering the base 191. The cover 192 is fastened to the base 191 by using fastening means 194 such as screws to constitute the pusher 190.

The cover 192 is provided with a cover vacuum hole 193 for transferring the vacuum pressure of the vacuum generator VG. Also, the base 191 has a plate seating portion 195 that is open to the upper side where the floating plate 170 is seated, and a base hole 196 that is open to the lower side so that the sensor terminal 12 of the image sensor package 10 can be inserted. The cover vacuum hole 193 is connected to an external vacuum generator VG and can transfer the vacuum pressure generated by the vacuum generator to the inside of the pusher 190.

This pusher 190 can load or unload the image sensor package 10 into or from the lower socket 130 by moving toward the lower socket 130 or moving away from the lower socket 130.

In addition to the structure shown, the pusher 190 may be modified into various other structures that can mount the upper circuit board 150 and the upper socket 160 and can be moved by the driving part DP.

The floating plate 170 is placed on the plate seating portion 195 of the pusher 190, and has a structure in which the upper socket 160 can be seated at the top and the vacuum adsorption sheet 180 can be coupled at the bottom.

As shown in FIGS. 5, 7A, and 7B, the floating plate 170 has a socket seating portion 171 upwardly open on which the upper socket 160 is seated, and a plate hole 172 downwardly open so that the lower surface of the elastic conductive portion 161 is exposed. On the lower surface of the floating plate 170, a plurality of guide portions 175 that guide the image sensor package are formed to protrude around the plate hole 172. This guide portion 175 is provided with an inclined surface 176 whose width becomes wider toward the bottom, so that the image sensor package 10 can be easily guided.

As shown in FIGS. 9A-9C, the floating plate 170 is provided with a plate vacuum hole 173 for transferring the vacuum pressure received from the upper circuit board 150 to the package adsorption hole 181 of the vacuum adsorption sheet 180. The plate vacuum hole 173 is formed around the region where the upper socket 160 is seated on the socket seating portion 171. The plate vacuum hole 173 is formed to be connected to the board vacuum hole 153 and the package adsorption hole 181, so that the vacuum pressure supplied from the vacuum generator VG is transferred to the plate vacuum hole 173 through the board vacuum hole 153, and the vacuum pressure transferred to the plate vacuum hole 173 is transferred to the package adsorption hole 181.

The vacuum adsorption sheet 180 is coupled to the lower part of the floating plate 170. As shown in FIG. 8, in the central region of the vacuum adsorption sheet 180, the package adsorption hole 181 for adsorbing the image sensor package 10 is formed, and in the peripheral region thereof, guide holes 182 into which the guide portions 175 of the floating plate 170 can be inserted are formed at positions corresponding respectively to the guide portions 175.

In a state where the guide portions 175 of the floating plate 170 are inserted into the guide holes 182, the vacuum adsorption sheet 180 may be fastened to the upper socket 160 and the floating plate 170 by using a coupling means such as adhesive or screws.

FIGS. 9A-9C are views showing a state in which the upper socket 160 and the vacuum adsorption sheet 180 are coupled to the floating plate 170 according to an embodiment of the disclosure. As shown in the drawing, the package adsorption hole 181 of the vacuum adsorption sheet 180 has a square shape with a wide surface and is sized to surround the plate hole 172 of the floating plate 170. The size of the package adsorption hole 181 of the vacuum adsorption sheet 180 may be formed to be the same as, or slightly larger or smaller than, the size of the plate hole 172 of the floating plate 170. Therefore, in the test apparatus according to an embodiment of the disclosure, the vacuum adsorption region where vacuum pressure is applied to adsorb the image sensor package has a wide surface shape, so the image sensor package 10 can be vacuum adsorbed in a so-called "surface manner".

As the package adsorption hole 181 of the vacuum adsorption sheet 180 can be formed to be about the size of the plate hole 172 where the lower surface of the elastic conductive portion 161 is exposed, the area S of the package adsorption hole 181 can be formed to be at least 0.1 times the area of the image sensor package 10. This has an adsorption region at least three times larger than that of a legacy test apparatus using an upper socket with a pogo pin for an image sensor package; since the image sensor package can be adsorbed in a surface manner, it is possible to stably adsorb the image sensor package 10 without pickup errors compared to the legacy test apparatus.

The vacuum suction sheet 180 may be made of an inelastic insulating material. The vacuum adsorption sheet 180 made of an inelastic insulating material transfers the vacuum pressure received from the vacuum generator VG to the image sensor package 10 without loss, allowing the image sensor package 10 to be adsorbed without a pickup error. Polyimide film, FR4, engineering plastic, or insulation coated metal may be used as such an inelastic insulating material.

Since the vacuum adsorption sheet 180 is in the form of a sheet made of an inelastic insulating material, it has the advantage of mitigating the impact that occurs when it comes into contact with the image sensor package 10.

Additionally, a gasket may be disposed between the cover 192 of the pusher 190 and the upper circuit board 150 to provide vacuum sealing between the cover 192 and the upper circuit board 150. The gasket may be made of a non-metallic material such as rubber, asbestos, or Teflon. The gasket 157 is coupled so as to surround the cover vacuum hole 193 and the board vacuum hole 153, and a gasket insertion hole (not shown) into which the gasket 157 is inserted may be provided in the cover 192.

Additionally, a gasket may be disposed between the upper circuit board 150 and the floating plate 170. The gasket 158 is coupled so as to surround the board vacuum hole 153 and the plate vacuum hole 173, and a gasket insertion hole 174 may be provided on the upper surface of the floating plate 170 to allow the gasket 158 to be inserted. Such a gasket may be formed only between the cover and the upper circuit board, or only between the upper circuit board and the floating plate. However, it is more preferable to place a gasket both between the cover and the upper circuit board and between the upper circuit board and the floating plate because this can transmit vacuum pressure between joints without loss.

In the test apparatus 1000 for an image sensor package according to an embodiment of the disclosure, a vacuum line is formed by connecting the cover vacuum hole 193 to the board vacuum hole 153, connecting the board vacuum hole 153 to the plate vacuum hole 173, and connecting the plate vacuum hole 173 to the package adsorption hole 181, and thus the vacuum pressure (suction pressure or release pressure) generated from the vacuum generator VG can be transferred to the package adsorption hole 181 through the cover vacuum hole 193, board vacuum hole 153, and plate vacuum hole 173, which enables the image sensor package 10 to be adsorbed or released. FIG. 10 illustrates the formation of such a vacuum line VL.

Next, a description will be given of the operation of the test apparatus 1000 for an image sensor package according to an embodiment of the disclosure.

As shown in FIGS. 4, 11A, and 11B, the pusher 190 is lowered by the driving part DP so that the vacuum adsorption sheet 180 can adsorb the image sensor package 10.

The image sensor package 10 is adsorbed by the vacuum adsorption sheet 180 through a vacuum line VL formed by the vacuum pressure generated from the vacuum generator VG. The vacuum pressure of the vacuum generator is transferred to the vacuum adsorption sheet through the cover vacuum hole 193 of the cover 192, the board vacuum hole 153 of the upper circuit board 150, and the plate vacuum hole 173 of the floating plate 170, and the package adsorption hole 181 of the vacuum adsorption sheet adsorbs the image sensor package 10 in a surface manner by using the vacuum pressure. Here, the image sensor package 10 is aligned and adsorbed at the correct position along the inclined surface 176 of the guide portion 175.

Then, the vacuum adsorption sheet 180 coupled to the pusher 190 may transport the adsorbed image sensor package 10 onto the lower socket 130. That is, the pusher 190 may approach the image sensor package 10 in a standby position and adsorb the image sensor package 10 by using the package adsorption hole 181 of the vacuum adsorption sheet 180, and the pusher 190 may move over the lower socket 130 to place the image sensor package 10 on the package seating portion 132 of the lower socket 130. Here, the guide portion 175 of the floating plate 170 is inserted into the guide hole 136 of the lower socket 130, thereby aligning the image sensor package 10 to the right position on the package seating portion 132. At the same time, the protrusion 137 of the lower socket 130 is inserted into the lower socket protrusion insertion portion 197 of the pusher 190, and the pogo pin 131 of the lower socket 130 is disposed to be in contact with the electrode of the upper circuit board 150.

Then, when the pusher 190 further descends toward the lower socket 130 to press the image sensor package 10, the elastic conductive portion 161 of the upper socket 160 is connected to the sensor terminal 12 of the image sensor package 10, and the pogo pin 131 of the lower socket 130 is connected to the electrode of the upper circuit board 150. As a result, the lower socket 130, the upper circuit board 150, the upper socket 160, and the image sensor package 10 are electrically connected.

At this time, a test signal generated by the tester 140 is transmitted to the light source device 20 and is transmitted at the same time to the image sensor package 10 through the lower socket 130, the upper circuit board 150, and the upper socket 160; the image sensor package 10 receives the light emitted from the light source device 20 at the light-receiving surface 11; the tester 140 can examine optical or electrical characteristics, such as whether the amount of light received by the image sensor is constant, according to the signal received by the image sensor package 10.

After the test is completed, the pusher 190 may ascend, and the image sensor package 10 adsorbed on the pusher 190 may be unloaded from the lower socket 130 according to the movement of the pusher 190 and be transported to a loading equipment (not shown).

As described above, in the test apparatus for an image sensor package according to the disclosure, since the package adsorption hole that vacuum-adsorbs the image sensor package has a shape of a wide surface, the image sensor package can be stably adsorbed in a surface manner. Also, since the vacuum region is formed to be more than three times larger compared to a related-art one, image sensor packages can be picked and placed stably without pickup errors, significantly improving test yield.

Additionally, vacuum sealing is provided by inserting a non-metallic gasket into the joint region between the pusher cover and the upper circuit board and between the upper circuit board and the floating plate, so that the vacuum pressure provided by the vacuum generator can be smoothly applied to the vacuum adsorption sheet without loss.

Further, since the vacuum adsorption sheet that adsorbs the image sensor package is configured in the form of a sheet made of an inelastic insulating material, there is an advantage of mitigating the impact that occurs when it comes in contact with the image sensor package.

Further, the upper socket is composed of an elastic conductive portion having elasticity, and the elastic conductive portion of the upper socket is connected to the solder ball-shaped sensor terminal of the image sensor package in a surface contact manner that surrounds it, so that contact resistance can be reduced and misalignment does not occur, enabling stable connection and significantly improving test yield.

Further, since the elastic conductive portion of the upper socket is smoothly connected to the sensor terminal of the image sensor package and the electrode of the upper circuit board, it is possible to prevent damage to the sensor terminal of the image sensor package and the electrode of the upper circuit board.

Although the disclosure has been described above with reference to preferred examples, the scope of the disclosure is not limited to those described and shown above.

What is claimed is:

1. A test apparatus for image sensor packages, comprising:
   an image sensor package having a light-receiving surface at a bottom and a sensor terminal at a top;
   a light source device mounted on a tester that provides a test signal to emit light toward the light-receiving surface of the image sensor package;
   a lower socket mounted on the tester, and including a package seating portion on which the image sensor package is seated, a light source insertion portion where the light source device is placed at a bottom of the package seating portion, and a pogo pin electrically connecting the tester and an upper circuit board;
   an upper socket made of an elastic insulating material containing a plurality of conductive particles, and having an elastic conductive portion that electrically connects the upper circuit board and the image sensor package;
   a pusher to which the upper circuit board on which a board vacuum hole is formed is coupled, having a cover vacuum hole through which vacuum pressure of a vacuum generator is transferred, and capable of moving toward or away from the lower socket by using power received from a driving part; and
   a floating plate coupled to the pusher, having a plate vacuum hole formed therein, and having a socket seating portion on which the upper socket is seated and a plate hole at the top,
   wherein when a vacuum adsorption sheet having a package adsorption hole for adsorbing the image sensor package is coupled to a lower part of the floating plate, a vacuum line is formed by connecting the cover vacuum hole to the board vacuum hole, connecting the board vacuum hole to the plate vacuum hole, and connecting the plate vacuum hole to the package adsorption hole.

2. The test apparatus of claim 1, wherein the test signal provided from the tester is delivered to the image sensor package through the light source device, the lower socket, the upper circuit board, and the upper socket.

3. The test apparatus of claim 1, wherein a guide portion for guiding the image sensor package is formed on a lower surface of the floating plate so as to protrude therefrom, and the vacuum adsorption sheet is provided with a guide hole into which the guide portion is inserted.

4. The test apparatus of claim 1, wherein the package adsorption hole of the vacuum adsorption sheet is sized to surround the plate hole of the floating plate.

5. The test apparatus of claim 1, wherein an area of the package adsorption hole is 0.1 times or more than that of the image sensor package.

6. The test apparatus of claim 1, wherein the vacuum adsorption sheet is made of an inelastic insulating material.

7. The test apparatus of claim 6, wherein the inelastic insulating material is one of polyimide film, FR4, engineering plastic, or insulation coated metal.

8. The test apparatus of claim 1, wherein the pusher includes a base that accommodates the upper circuit board, the upper socket, and the floating plate, and a cover that covers the base.

9. The test apparatus of claim 8, wherein the cover vacuum hole is formed in the cover.

10. The test apparatus of claim 1, wherein a gasket surrounding the cover vacuum hole and the board vacuum hole is coupled between the cover and the upper circuit board.

11. The test apparatus of claim 1, wherein a gasket surrounding the board vacuum hole and the plate vacuum hole is coupled between the upper circuit board and the floating plate.

* * * * *